(12) United States Patent
Iwata et al.

(10) Patent No.: US 6,399,410 B1
(45) Date of Patent: Jun. 4, 2002

(54) METHOD OF ANODIZING SILICON SUBSTRATE AND METHOD OF PRODUCING ACCELERATION SENSOR

(75) Inventors: Hitoshi Iwata; Makoto Murate, both of Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 0 days.

(21) Appl. No.: 09/509,448

(22) PCT Filed: Sep. 25, 1998

(86) PCT No.: PCT/JP98/04312

§ 371 (c)(1),
(2), (4) Date: Mar. 28, 2000

(87) PCT Pub. No.: WO99/17375

PCT Pub. Date: Apr. 8, 1999

(30) Foreign Application Priority Data

Sep. 29, 1997 (JP) .............................................. 9-264401

(51) Int. Cl.[7] .............................................. H01L 21/00
(52) U.S. Cl. ........................... 438/50; 438/52; 438/238; 204/219; 216/2; 437/21
(58) Field of Search ............................ 438/50, 52, 238; 204/129; 437/51; 216/2

(56) References Cited

U.S. PATENT DOCUMENTS

| | | | | |
|---|---|---|---|---|
| 5,360,521 A | * | 11/1994 | Davis et al. | 204/129.3 |
| 5,542,558 A | * | 8/1996 | Benz et al. | 216/2 |
| 5,747,353 A | * | 5/1998 | Bashir et al. | 437/21 |
| 5,980,308 A | * | 11/1999 | Lee | 438/52 |
| 6,074,890 A | * | 6/2000 | Yao et al. | 438/52 |

OTHER PUBLICATIONS

Abstract of 087228016, dated Sep. 3, 1996.
Abstract of 05082806, dated Apr. 2, 1993.
Abstract of 06260660, dated Sep. 16, 1994.

* cited by examiner

Primary Examiner—Amir Zarabian
Assistant Examiner—Pho Luu
(74) Attorney, Agent, or Firm—Vidas,Arrett&Steinkraus PA

(57) ABSTRACT

A method for anodizing silicon substrate includes forming an n-type silicon embedded layer (21) made of n-type silicon on a predetermined area of a first surface of the p-type single crystal silicon substrate (2). N-type silicon layers (4, 6) are formed on the upper surface of the p-type single crystal silicon substrate (2) and on the n-type silicon embedded layer (21). Silicon diffusion layers (5, 7) containing high-concentration p-type impurities are formed on predetermined areas of the n-type silicon layers (4, 6) to contact the n-type silicon embedded layer (21). An electrode layer (13) is formed on the lower surface of the p-type silicon substrate (2). The anode of a DC power source (15) is connected to the electrode layer (13), and the cathode is connected to a counter electrode (23), which is opposed to the p-type silicon substrate (2). A current is intensively applied to an area corresponding to an opening (21a) of the n-type silicon layer (4) in a direction from the lower surface to the upper surface of the p-type single crystal silicon substrate (2), which makes the area porous.

15 Claims, 6 Drawing Sheets

METHOD OF ANODIZING SILICON SUBSTRATE AND METHOD OF PRODUCING ACCELERATION SENSOR

BACKGROUND OF THE INVENTION

The present invention relates to a method for anodizing silicon substrates and a method for manufacturing acceleration sensors using the anodization method.

Figure 9:
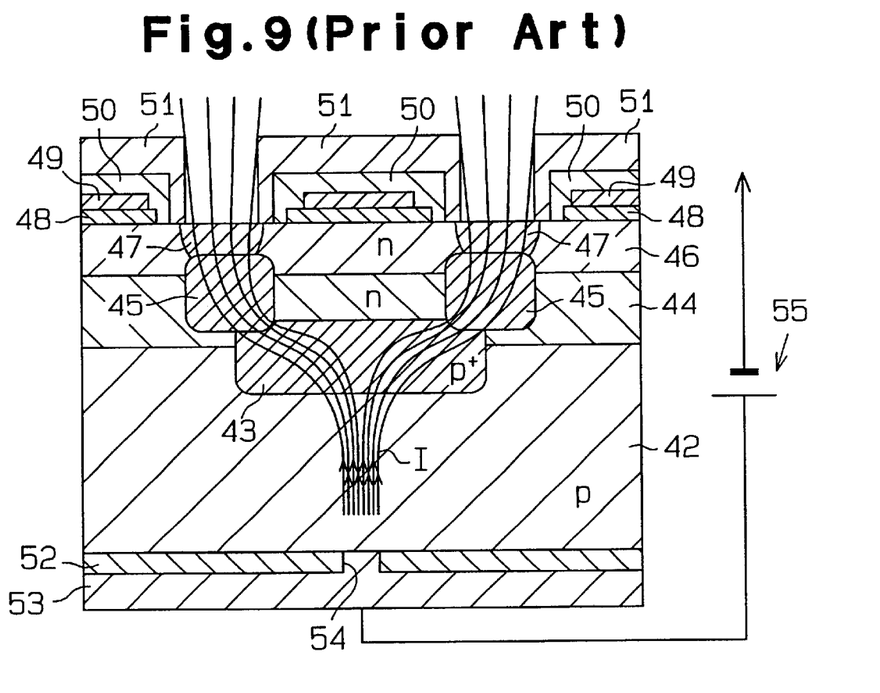
FIG. 9 is a schematic cross-sectional view of a silicon substrate, which is anodized according to a conventional anodization method.
Figure 10:
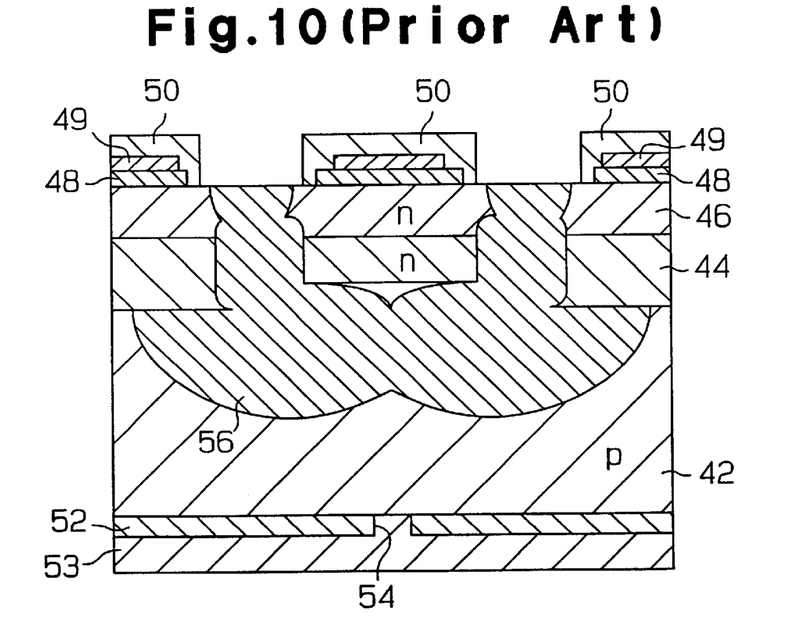
FIG. 10 is a schematic cross-sectional view of the silicon substrate of FIG. 9, which has become porous through the anodization.
Figure 11:
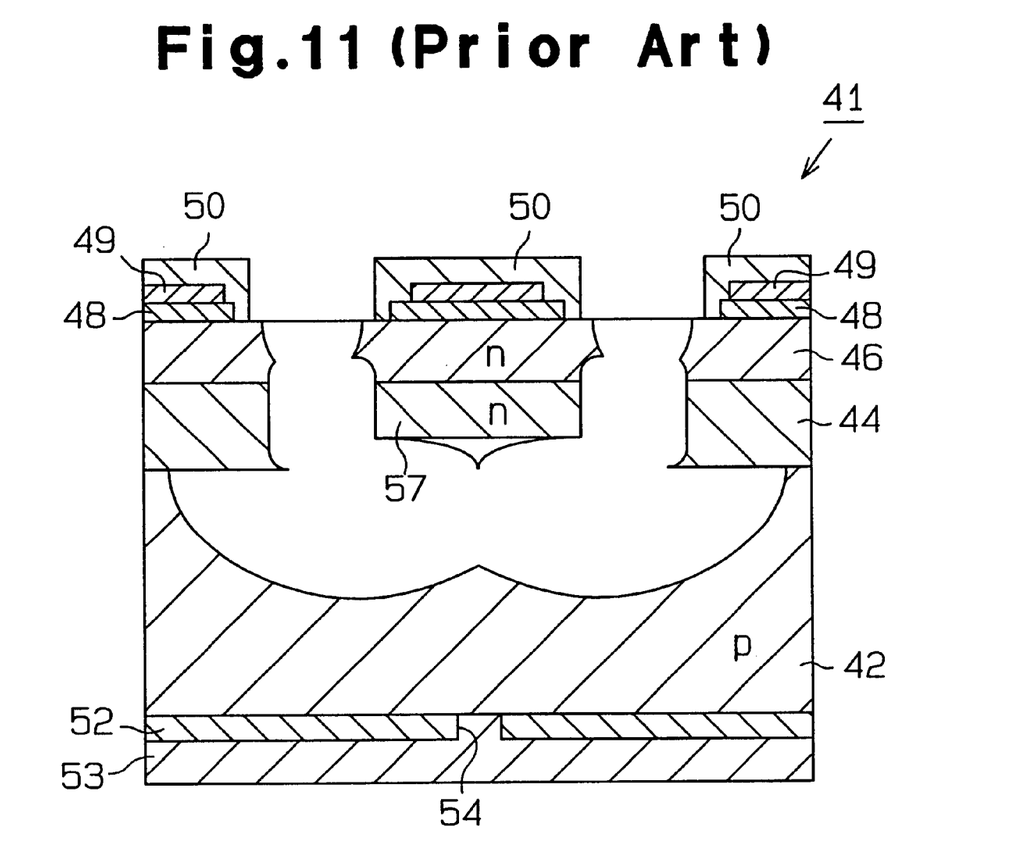
FIG. 11 is a schematic cross-sectional view of a completed acceleration sensor, which has been formed through alkaline etching.

In recent years, acceleration sensors have been used in controlling devices such as ABS (antilock brake system), airbag systems, and suspension control systems. A surface-type acceleration sensor is known as a kind of acceleration sensor. The surface-type acceleration sensor includes a silicon substrate, a displaceable mass portion formed on the upper surface of the substrate, and a deformation gauge formed on the surface of the mass portion. In recent years, anodization technologies have been used to form the mass portion. With reference to FIGS. 9–11, a method for manufacturing a conventional surface-type acceleration sensor 41 using anodization will now be described.

FIG. 9 shows a p-type single crystal silicon substrate 42, which is anodized. On a predetermined area of the upper surface of the p-type single crystal silicon substrate 42, a p+ silicon embedded layer 43 is formed. A first epitaxial growth layer 44, which is made of n-type silicon, is laminated on the substrate 42. p+ silicon diffusion layers 45 are embedded in predetermined areas of the first epitaxial growth layer 44. A second epitaxial growth layer 46, which is made of n-type silicon, is laminated on the first epitaxial growth layer 44. On a predetermined area of the second epitaxial growth layer 46, p+ silicon diffusion layers 47 are formed and are exposed to the exterior. On the second epitaxial growth layer 46, oxide film 48, wiring patterns 49, passivation film 50, and metal protection film 51 are formed. A deformation gauge (not shown) is also formed in the second epitaxial growth layer 46. An oxide film 52 and an electrode layer 53 are laminated in that order on the bottom surface of the substrate 42. The electrode layer 53 is electrically connected to the substrate 42 through a connection opening 54.

To perform anodization, the anode of a DC power supply 55 is connected to the electrode layer 53, and the cathode is connected to a counter electrode (not shown). In this state, the substrate 42 and the counter electrode are immersed in a hydrofluoric acid solution. Then, a direct current I flows from the lower side of the substrate 42 to the upper side, which selectively becomes porous. During anodization, mainly the embedded layer 43, the diffusion layer 45, and the diffusion layer 47 are changed into porous silicon layer 56 (see FIG. 10).

Then, the porous silicon layer 56 is selectively dissolved and removed by etching using alkaline etchant, which makes the substrate 42, which includes the layers 44, 46, hollow. As a result, mass portions 57 are formed on the epitaxial growth layers 44, 46, which form the acceleration sensor 41 as shown in FIG. 11.

However, in the conventional method, the direct current is applied to an area outside the area designated for anodization. This slows the anodization. Accordingly, a more efficient anodization method has been requested.

Also, in the conventional method, the range that becomes porous may be wider than the designated area. This increases the amount of the porous part that is removed by the etching and reduces the size of the mass portions 57. In this way, the amount of wasteful removal increases and it is difficult to form a large mass portion 57. Therefore, it is difficult to produce a highly sensitive surface-type acceleration sensor using the anodization method.

Further, in the conventional method, holes may be formed in the side surfaces when the porous part is expanded to the periphery of the substrate 42. To avoid this, the size of substrate must be increased, which prevents making the acceleration sensors compact.

SUMMARY OF THE INVENTION

To solve the above problems, an objective of the present invention is to provide an anodization method for silicon substrates that efficiently makes a designated area porous.

Another objective of the present invention is to provide a method for manufacturing compact and highly sensitive surface-type acceleration sensors.

To achieve the above objectives, the present invention provides a method for anodizing a silicon substrate comprising: providing a p-type single crystal silicon substrate; forming an n-type silicon embedded layer made of n-type silicon on a predetermined area of a first surface of the p-type single crystal silicon layer, wherein an opening for permitting a current to flow is formed in the center of the n-type silicon embedded layer; forming an n-type silicon layer on the first surface of the p-type single crystal silicon substrate and on the n-type silicon embedded layer; forming a silicon diffusion layer containing a high-concentration p-type impurity on a predetermined area of the n-type silicon layer, wherein the silicon diffusion layer contacts at least the n-type silicon embedded layer in the vicinity of the interface between the p-type single crystal silicon substrate and the n-type silicon embedded layer; forming an electrode layer on a second surface, which is on the opposite side of the p-type silicon substrate from the first surface; connecting the anode of a DC power source to the electrode layer and connecting the cathode to a counter electrode, which is opposed to the p-type silicon substrate; and concentrating a current flow to an area corresponding to the opening of the n-type silicon layer in a direction from the second surface of the p-type single crystal silicon substrate toward the first surface, and advancing porosity formation in the area from the first surface toward the second surface.

In the present invention, a direct current is intensely applied to an area corresponding to an opening of the p-type single crystal silicon substrate during the anodization. Accordingly, the current is efficiently applied to the designated area, which increases the anodization speed and prevents the area outside the designated area from becoming porous.

The present invention also provides a method for manufacturing a surface-type acceleration sensor having a displaceable mass portion formed on an upper surface of a silicon substrate and a deformation gauge formed on the upper surface of the mass portion, the method comprising: providing a p-type single crystal silicon substrate; forming an n-type silicon embedded layer made of n-type silicon on a predetermined area of a first surface of the p-type single crystal silicon layer, wherein an opening for permitting a current to flow is formed in the center of the n-type silicon embedded layer; forming an n-type silicon layer on the first surface of the p-type single crystal silicon substrate and on the n-type silicon embedded layer; forming a silicon diffusion layer containing a high-concentration p-type impurity on a predetermined area of the n-type silicon layer, wherein the silicon diffusion layer contacts at least the n-type silicon embedded layer in the vicinity of the interface between the p-type single crystal silicon substrate and the n-type silicon embedded layer; forming the deformation gauge on the n-type silicon layer; forming a wiring over the n-type silicon layer; forming an electrode layer on a second surface, which is on the opposite side of the p-type silicon substrate from the first surface; connecting the anode of a DC power source to the electrode layer and connecting the cathode to a counter electrode, which is opposed to the p-type silicon substrate; concentrating a current flow to an area corresponding to the opening of the n-type silicon layer in a direction from the second surface of the p-type single crystal silicon substrate toward the first surface, and changing the area into a porous silicon layer from the first surface toward the second surface; and forming the mass portion by dissolving and removing the porous silicon layer using alkali etching.

A semiconductor device preferable for anodization for making silicon porous comprises: a p-type single crystal silicon substrate; an n-type silicon embedded layer, which is made of n-type silicon and is formed on a predetermined area of a first surface of the p-type single crystal silicon substrate; an opening, which is located in the center of the n-type silicon embedded layer to permit a flow of current; an n-type silicon layer, which is formed on the first surface of the p-type single crystal silicon substrate and on the n-type silicon embedded layer; a silicon diffusion layer, which is formed in a predetermined area of the n-type silicon layer in the vicinity of the interface between the p-type single crystal silicon substrate and the n-type silicon layer to contact at least the n-type silicon embedded layer; and a high-concentration p-type impurity, which is contained in the silicon diffusion layer; and an electrode layer, which is formed on a second surface that is located on the opposite side of the p-type silicon substrate from the first surface.

BEST MODE FOR CARRYING OUT THE INVENTION

A method for manufacturing a surface-type acceleration sensor 1 according to one embodiment of the present invention will now be described with reference to FIGS. 1–7. First, the structure of a semiconductor element, which includes a p-type single crystal silicon substrate 2 and is anodized, will be described with reference to FIG. 1.

Figure 1:
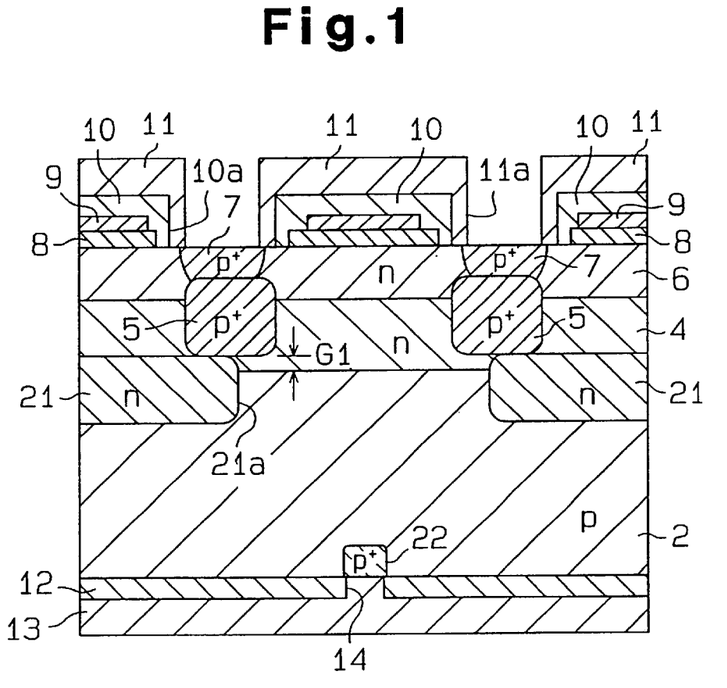
FIG. 1 is a schematic cross-sectional view of a silicon substrate, which is anodized according to one embodiment of the present embodiment.

As shown in FIG. 1, the p-type single crystal silicon substrate 2 is a rectangular parallelepiped and has an orientation flat (110). The thickness of the substrate 2 is 500 $\mu$m–600 $\mu$m. Instead of the substrate 2 having the orientation flat (110), a substrate having other orientation flats, for example, (111), (100), may be used. When a substrate having an orientation flat (100) is used, a more sensitive acceleration sensor is produced. A first epitaxial growth layer 4, which is made of n-type single crystal silicon, is laminated on the entire substrate 2. $p^+$ silicon diffusion layers 5 are embedded in predetermined areas of the first epitaxial growth layer 4. In the present embodiment, the $p^+$ silicon diffusion layers do not contact the substrate 2. A second epitaxial growth layer 6, which is made of n-type single crystal silicon, is laminated on the first epitaxial growth layer 4. $p^+$ silicon diffusion layers 7 are formed in predetermined areas of the second epitaxial growth layer 6. The $p^+$ silicon diffusion layers 7 are located to correspond to the positions of the $p^+$ silicon diffusion layers 5 and contact the layers 5. A plurality of diffusion-type deformation gauges 28 (see FIG. 6) are formed on the upper surface of the second epitaxial growth layer 6. The deformation gauges 28 are located at the parts of the second epitaxial growth layer that will form beams 29 (imaginarily shown in FIG. 6). Instead of the diffusion-type deformation gauges 28, thin-film deformation gauges, which are made of, for example, chromium (Cr) or polycrystal silicon, may be used.

As shown in FIG. 1, thin silicon oxide film ($SiO_2$ film) 8, which serves as an inter-layer insulation layer, is formed on the upper surface of the second epitaxial growth layer 6. Wiring patterns 9 and bonding pads (not shown), which are preferably made of aluminum using a physical film formation method, such as sputtering and vacuum evaporation, are formed on the oxide film 8. The wiring patterns 9 and the bonding pads may be made of other metals such as gold (Au). Contact holes (not shown) for connecting layers are formed in predetermined parts of the oxide film 8 corresponding to the deformation gauges 28. The wiring patterns 9 are electrically connected to the deformation gauges 28 through the contact holes.

The wiring patterns 9 are electrically connected to the bonding pads, respectively. Conductive layers such as the wiring patterns 9 and the oxide film 8 are entirely covered with a passivation film (SiN film) 10 to insulate the surface. Further, the passivation film 10 is entirely covered with a metal protection film 11. The passivation film 10 and the metal protection film 11 are formed by the above physical film formation method. The passivation film 10 and the metal protection film 11 include openings 10a, 11a respectively. The $p^+$ silicon diffusion layer 7 is exposed to the exterior through the opening 11a.

Figure 7:
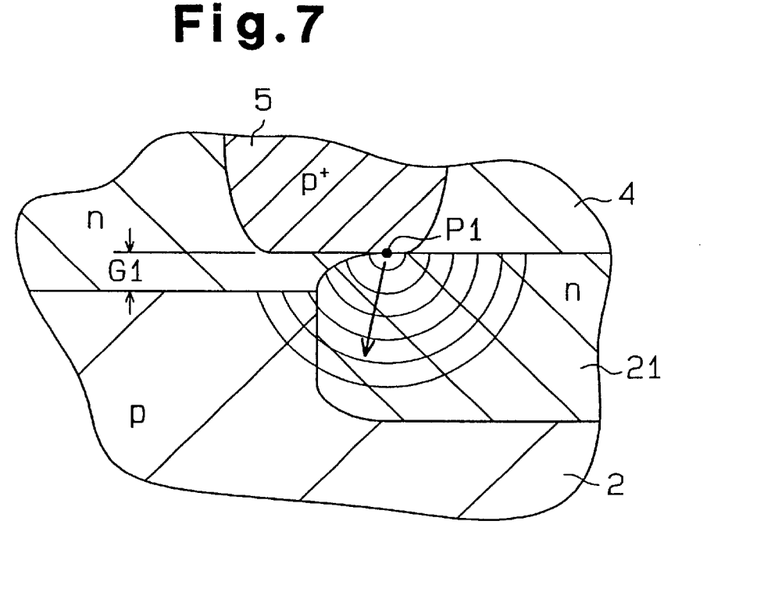
FIG. 7 is a partial enlarged cross-sectional view of the silicon substrate during the anodization.

Further, an n-type silicon embedded layer 21, which is made of n-type silicon, is formed near the interface between the substrate 2 and the first epitaxial growth layer 4. The n-type silicon has fewer holes that contribute to anodization than the p-type silicon. The embedded layer 21 is formed by injecting and diffusing impurities, and part of the layer 21 is located in the first epitaxial growth layer 4 due to expansion. Therefore, the embedded layer 21 partly contacts the bottom of the silicon diffusion layer 5. In FIG. 7, the contact between the layers 5, 21 is shown by P1. The embedded layer 21 includes an opening 21a for the intensive flow of direct current in a designated area of the substrate 2. The opening 21a is located to correspond to an area surrounded by the p⁺ silicon diffusion layer 7 and the p⁺ silicon diffusion layer 5.

On the other hand, an oxide film 12, which serves as an insulation layer, is entirely formed on the lower surface of the substrate 2. An electrode layer 13, which is preferably made of titanium (Ti) film or Cr film, is formed on the oxide film 12. The electrode layer 13 is electrically connected to the substrate 2 through a connection opening 14. The connection opening 14 is located to correspond to the opening 21a of the embedded layer 21. The opening area of the connection opening 14 is smaller than that of the opening 21a. On the lower surface of the substrate 2 corresponding to the opening 14, a p⁺ silicon diffusion layer 22 is formed to be electrically connected to the opening 14. The p⁺ silicon diffusion layer 22 is preferably formed on an area as small as the opening 21a. The diffusion layer 22 is a high-concentration impurity diffusion layer, which includes more holes that contribute to anodization than the p-type silicon and helps a direct current to flow during anodization.

A method for manufacturing the acceleration sensor 1 will now be described with reference to FIGS. 2–6.

The substrate 2 in the state of FIG. 1 is formed prior to anodization. The substrate 2 is a rectangular parallelepiped and has an orientation flat (110). A mask (not shown) is formed on the upper surface of the substrate 2. Then, n-type impurities, such as phosphorous, are injected and thermally diffused in the substrate 2. This forms the n-type silicon embedded layer 21 on the substrate 2. The opening 21a is located at the center of the substrate 2 to correspond to the mass portion 17 (see FIG. 6), which is formed later.

Then, the first epitaxial growth layer 4, which is made of n-type single crystal silicon, is formed by gas phase growth on the entire upper surface of the substrate 2, including the embedded layer 21. As a result, the embedded layer 21 is embedded in the first epitaxial growth layer 4. Then, the mask (not shown) is formed on the first epitaxial growth layer 4. An opening is formed on a predetermined area of the mask by photoetching. p-type impurities, such as boron, are injected in the first epitaxial growth layer 4 through the opening preferably by the ion implantation and are thermally diffused. This forms the p⁺ silicon diffusion layer 5 on the first epitaxial growth layer 4. The p³⁰ silicon diffusion layer 5 contacts the embedded layer 21, but does not reach the upper surface of the substrate 2. A certain gap G1 is secured between the upper surface of the substrate 2 and the lower part of the p⁺ silicon diffusion layer 5.

Then, the second epitaxial growth layer 6, which is made of n-type single crystal silicon, is formed by gas phase growth on the upper surface of the first epitaxial growth layer 4. As a result, the p⁺ silicon diffusion layer 5 is embedded in the second epitaxial growth layer 6. Then, a mask (not shown) is formed on the second epitaxial growth layer 6, and an opening is formed on a predetermined area of the mask by photoetching. The p⁺ silicon diffusion layer 7, which reaches the p⁺ silicon diffusion layer 5, is formed in the second epitaxial growth layer 6 by the injection and thermal diffusion of the p-type impurities. The p⁺ silicon diffusion layers 5, 7 are located to correspond to the sides of a mass portion 17 (FIG. 6,) which is formed later.

Then, a mask (not shown) is arranged on the upper surface of the second epitaxial growth layer 6, and the p-type impurities are injected and thermally diffused through the mask. This forms the diffusion deformation gauges 28 at the part of the mass portion 17 that is easily displaced. Then, the substrate 2 is heated in oxygen or air after the formation of the deformation gauges, which forms the oxide films 1, 12 on the upper and lower surfaces of the substrate 2. Then, a contact hole (not shown) is formed at a predetermined part of the upper oxide film 8 by photoetching.

Then, after sputtering or vacuum evaporation using Al (aluminum), the wiring patterns 9 and the bonding pads (not shown) are formed on the upper surface of the oxide film 8 by photolithography. Further, the passivation film 10 having the opening 10a is formed preferably using CVD (chemical vapor deposition), by depositing SiN or $Si^3N^4$. After the formation of the passivation film, sputtering or vacuum evaporation preferably using a hydrofluoric-acid-resistant metal such as W (tungsten) or Mo (molybdenum) and photolithography are performed, which forms the metal protection film 11 with the opening 11a on the passivation film 10. Then, the oxide film 8 in the openings 10a, 11a is removed to expose the upper surface of the p⁺ silicon diffusion layer 7.

The p-type impurities are injected and thermally diffused in the lower surface of the substrate 2 with a mask (not shown) arranged under the oxide film 12. This forms the p⁺ silicon diffusion layer 22 on the lower surface of the substrate 2 to correspond to the opening 14. Then, sputtering or vacuum evaporation, preferably using Ti, Cr is performed, which forms the electrode layer 13 on the entire surface of the oxide film 12. The electrode layer 13 is connected to the p⁺ silicon diffusion layer 22 through the opening 14. The formation of the layers 13, 22 may be performed either before or after the formation of the passivation film 10. The electrode layer 13 may be simultaneously formed using the same metal as the metal protection film 11 when the protection film 11 is physically formed.

Figure 2:
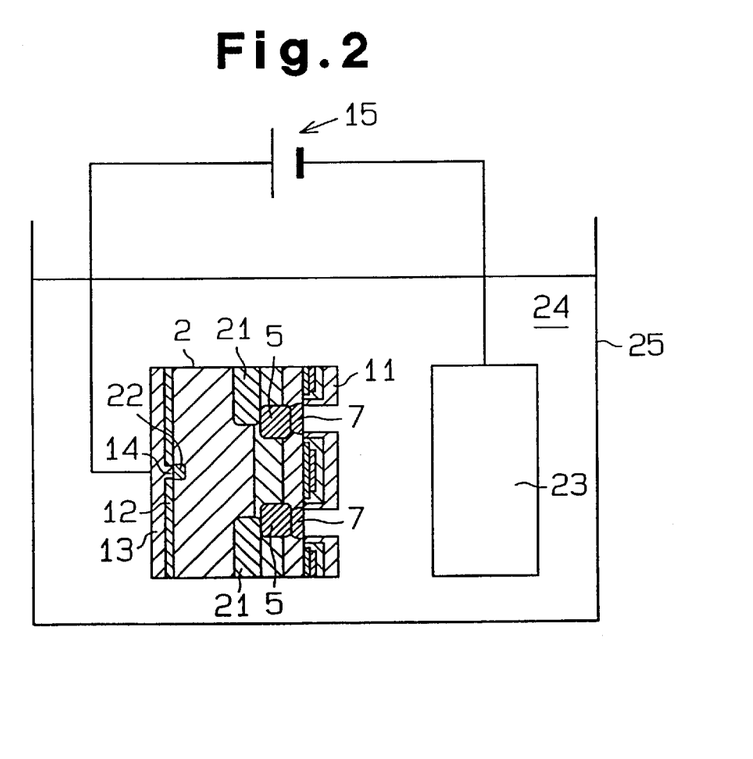
FIG. 2 is a schematic view of the silicon substrate of FIG. 1, which is connected to a power supply so it can be anodized.

The anodization of the substrate 2 will now be described. As shown in FIG. 2, an anodization tank 25 is filled with high-concentration hydrofluoric acid solution 24, which serves as an acid solution for anodization. A counter electrode 23, which is preferably made of platinum, is immersed in the hydrofluoric acid solution 24 and faces the upper surface of the substrate 2. The electrode layer 13 is electrically connected to the anode of a DC power source 15, and the counter electrode 23 is electrically connected to the cathode of the DC power source 15. Accordingly, a direct current flows from the lower surface to the upper surface of the substrate 2. The flow of the current is shown by the lines I in FIGS. 3, 4. The electrons flow opposite to the flow of the current, and the formation of a porous portion is performed along the flow of the current by the supply of electrons to the hole.

Figure 3:
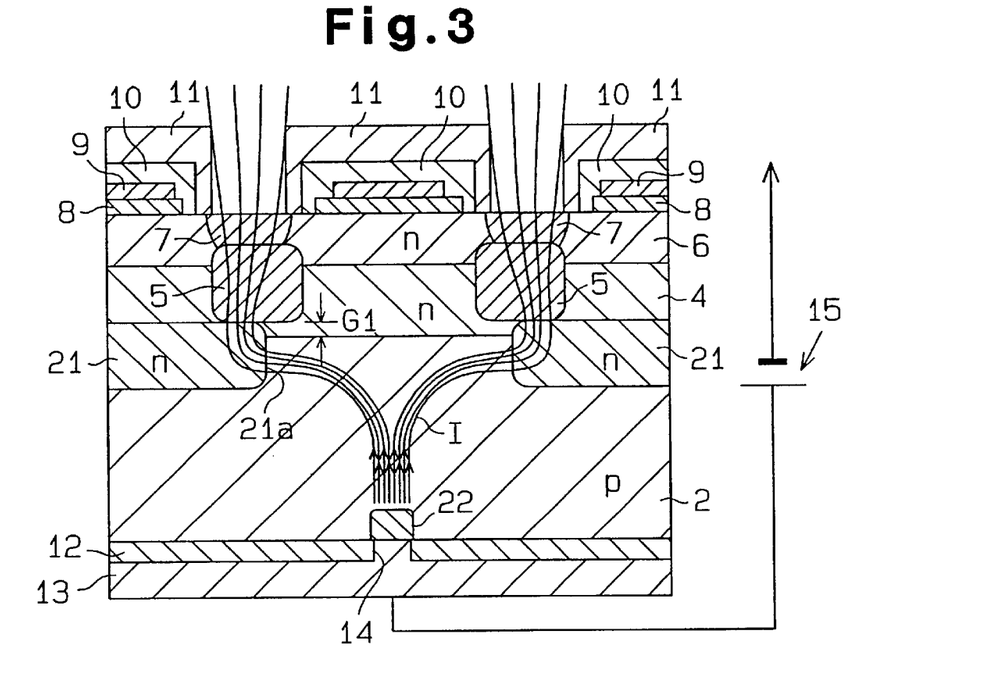
FIG. 3 is a schematic cross-sectional view of the silicon substrate in an early anodization stage.
Figure 4:
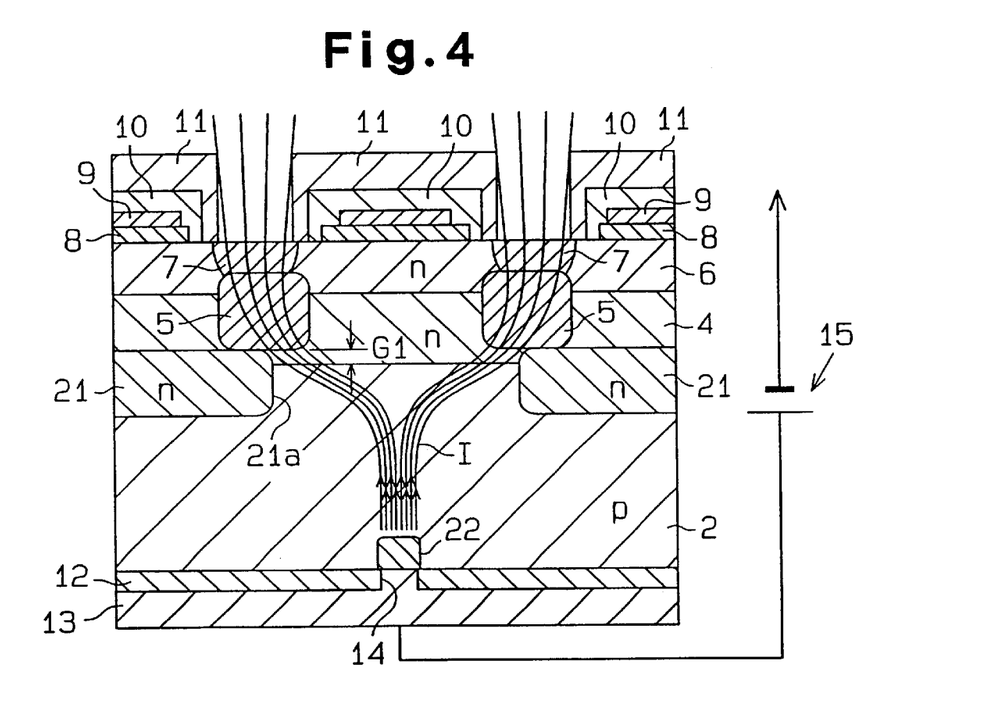
FIG. 4 is a schematic cross-sectional view of the silicon substrate in the middle anodization stage.
Figure 5:
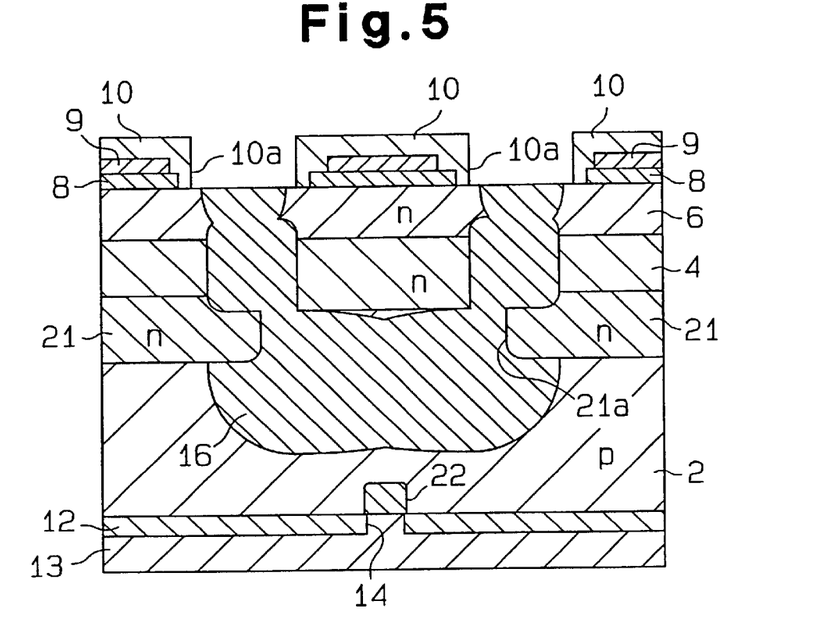
FIG. 5 is a schematic cross-sectional view of the silicon substrate that has become porous through the anodization.

As shown in FIG. 3, the p⁺ silicon diffusion layer 7 on the uppermost surface side first turns porous in the early stage of anodization, and then, the p⁺ silicon diffusion layer 5 below turns porous. At this time, a current flows through the n-type silicon embedded layer 21 having a small specific resistance (depletion layer at the pn connection is narrow), rather than flow beyond the gap G1. Therefore, after the p⁺ silicon diffusion layer 7 becomes porous, the n-type silicon embedded layer 21 becomes porous. This is because the injection of electrons in the holes of the embedded layer 21 is dominant.

The porosity formation is schematically shown by FIG. 7. As shown in FIG. 7, the porosity formation advances isotropically from the contact point p1. When the porosity formation reaches the substrate 2, current flows through the thin gap G1 of the epitaxial growth layer 4 (see FIG. 4). This is because the p-type silicon has more holes than the n-type silicon, and injection of electrons in the holes of the substrate 2 becomes more dominant than in the holes of the embedded layer 21. Therefore, at this time, the porosity formation in the n-type silicon embedded layer 21 stops.

Also, electrons converge in the center of the substrate 2 and flow toward the lower side. Accordingly, porosity is formed around the opening 21a along the flow of the electrons.

When the above anodization is completed, all of the $p^+$ diffusion layers 5, 7, the vicinity of the opening 21a in the substrate 2, and the vicinity of the contact point P1 of the embedded layer 21 are changed to a porous silicon layer 16.

Figure 6:
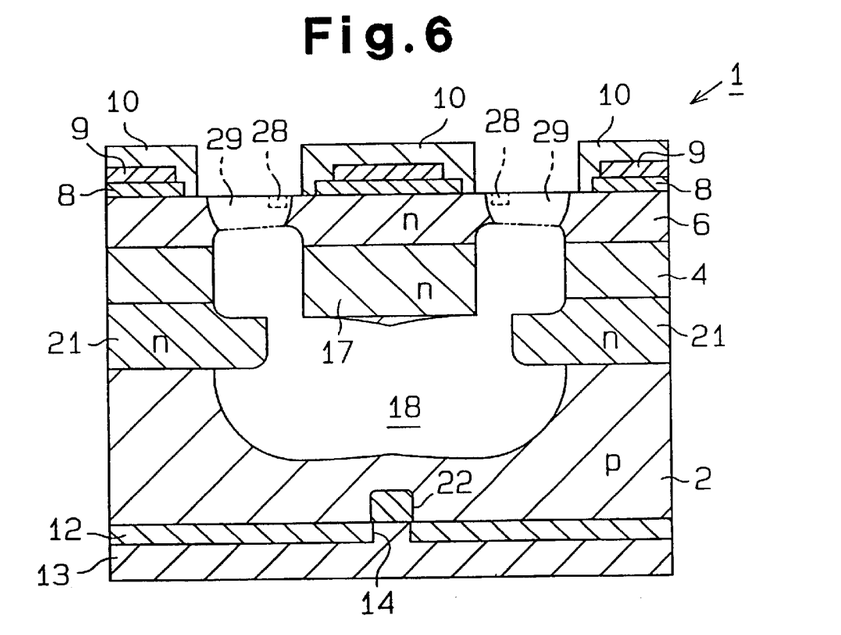
FIG. 6 is a schematic cross-sectional view of an acceleration sensor, which has been formed through alkaline etching.

After the anodization process, the metal protection film 11 is separated. Then, etching is performed using alkaline etchant such as THAM (tetrametyl ammonium hydroxide). An alkaline etchant, such as KOH, hydrazine, EPW (ethylenediamine-pyrocatechol-water) may be used. As a result, as shown in FIG. 6, the porous silicon layer 16 is dissolved and removed by anisotropic etching. The porous silicon layer 16 is more easily dissolved by alkali than a compact silicon layer, which facilitates the formation of a cavity 18. A mass portion 17, which is mainly made of the epitaxial growth layers 4, 6, is formed in the cavity 18, and the acceleration sensor 1 is completed. The mass portion 17 is displaced when acceleration is applied. The acceleration sensor may be a cantilever-type or a both-ends-fixed type.

The advantages of the present invention will now be described.

In the anodization method of the present invention, the n-type silicon embedded layer 21 is formed in advance near the interface between the substrate 2 and the first epitaxial growth layer 4 to partially contact the $p^+$ silicon diffusion layer 5. The n-type silicon has fewer holes than the p-type silicon. The opening 21a is formed in advance in a predetermined area of the n-type silicon embedded layer 21. Therefore, a direct current concentrates on the area corresponding to the opening 21a of the substrate 2. Accordingly, since the current effectively flows in a predetermined area, the anodization speed is increased and only the designated area efficiently turns porous. Also, since the current is concentrated on the designated area, the expansion of porosity formation on the undesignated peripheral area of the substrate 2 is prevented. Accordingly, holes are prevented from opening in the side wall of the substrate and there is no need to increase the size of the substrate 2.

In the anodization method of the present embodiment, the electrode film 13 is electrically connected to the substrate 2 through the opening 14 on the lower surface of the substrate 2, and the opening 14 is located to correspond to the opening 21a. This causes the DC current to be concentrated on the area corresponding to the opening 21a (see FIGS. 3, 4). Therefore, expansion of current to the periphery of the substrate 2 is prevented, and only the designated area is efficiently turned porous. This contributes to selective porosity formation and improving efficiency.

In the anodization method of the present embodiment, the $p^+$ silicon diffusion layer 22 is formed in advance on the part corresponding to the opening 14 in the lower surface of the substrate 2. During the anodization, the direct current is given priority to flow to the $p^+$ silicon diffusion layer 22 and concentrates on the opening 14.

In the present embodiment, the acceleration sensor 1 is manufactured using the above efficient anodization method. Therefore, the area that is dissolved and removed by alkali etching decreases and the formation of a large mass portion 17 is relatively easy regardless of the small size of the substrate 2. Therefore, a compact and highly sensitive surface-type acceleration sensor 1 is efficiently manufactured. The following are reasons for the mass portion 17 being larger than in the prior art. In the prior art shown in FIG. 9, the $p^+$ silicon embedded layer 43 is formed under the part on which the bottom surface of the mass portion 17 is formed. However, the embedded layer 43 expands toward the first epitaxial growth layer 44, which causes the porosity formation area to expand upward. On the other hand, in the present embodiment, the $p^+$ silicon embedded layer is not formed on the concerned part, and the above problem is prevented and the first epitaxial growth layer 4 is prevented from becoming thin. The thicker the first epitaxial growth layer 4, the larger the mass portion 17.

The method for manufacturing the acceleration sensor 1 of the present invention has the following additional advantages.

First, since the $p^+$ silicon diffusion layers 5, 7 are anodized after the layers 5, 7 are formed on the determined areas in advance, the depth and shape of the anodization is more uniform compared to the method in which the upper surface of the substrate 2 is directly anodized. Second, since the alkali etching is performed after the passivation process is completed, the wiring patterns 9 and the bonding pads are not contaminated by the etchant. Third, since the porous silicon layer 16 is dissolved and removed, the manufacturing process is not limited by the flat orientation of the substrate 2. Fourth, since the manufacturing method is basically similar to the process of manufacturing bipolar ICs, the acceleration sensor 1 can be integrated with a bipolar IC.

The present invention is not limited to the above embodiment and can be varied as follows.

Figure 8:
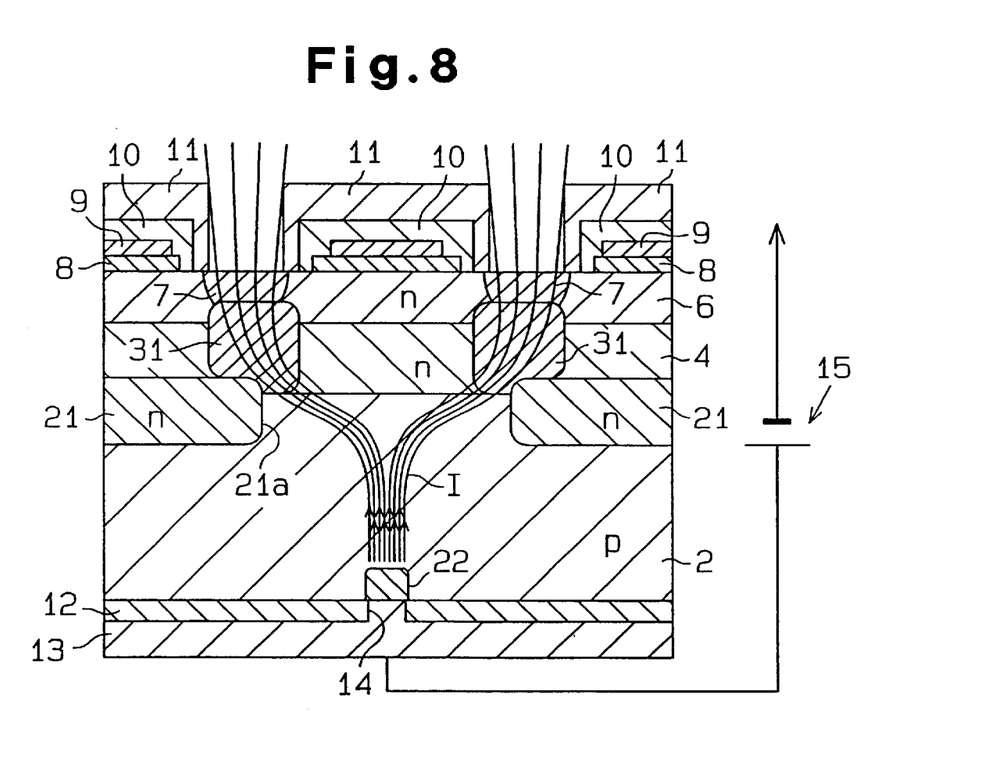
FIG. 8 is a schematic cross-sectional view of a silicon substrate showing another example of the anodization method.

As shown in FIG. 8, the depth of a $p^+$ silicon diffusion layer 31 may be changed to reach the substrate 2. If the anodization is performed in this state, a current flows along the route shown in FIG. 8, and porosity formation advances in a direction opposite to the current flow.

In the above embodiment, the anodization may be performed without the $p^+$ silicon diffusion layer 22. Further, in manufacturing the acceleration sensor 1, an n-type polycrystal silicon layer or amorphous silicon layer may be formed instead of the n-type single crystal silicon epitaxial growth layer.

In the above embodiment, a bipolar IC, which serves as a signal logic circuit, may be formed in a space around the mass portion 17 on the upper surface of the substrate 2.

The anodization method of the present invention may be applied to sensors other than the acceleration sensor 1 and further, may be applied to semiconductor products other than sensors.

The definition of the anodization in the present specification is that a current is applied to a substrate as an anode in an electrolytic solution to form a porous layer in the substrate.

What is claimed is:
1. A method for anodizing a silicon substrate comprising:
providing a p-type single crystal silicon substrate;
forming an n-type silicon embedded layer made of n-type silicon on a predetermined area of a first surface of the p-type single crystal silicon layer, wherein an opening for permitting a current to flow is formed in the center of the n-type silicon embedded layer;
forming an n-type silicon layer on the first surface of the p-type single crystal silicon substrate and on the n-type silicon embedded layer;
forming a silicon diffusion layer containing a high-concentration p-type impurity on a predetermined area of the n-type silicon layer, wherein the silicon diffusion layer contacts the n-type silicon embedded layer in the vicinity of the interface between the p-type single crystal silicon substrate and the n-type silicon embedded layer, and wherein a gap is defined between the first surface of the p-type silicon substrate and the silicon diffusion layer;

forming an electrode layer on a second surface, which is on the opposite side of the p-type silicon substrate from the first surface;

connecting the anode of a DC power source to the electrode layer and connecting the cathode to a counter electrode, which is opposed to the p-type silicon substrate; and concentrating a current flow to an area corresponding to the opening of the n-type silicon layer in a direction from the second surface of the p-type single crystal silicon substrate toward the first surface, and advancing porosity formation in the area from the first surface toward the second surface.

2. The method according to claim 1 further including forming an insulation layer having a connection opening on the second surface of the p-type single crystal silicon substrate to correspond to the opening of the n-type silicon layer; and the formation of the electrode layer includes electrically connecting the electrode layer to the p-type single crystal silicon substrate through the connection opening.

3. The method according to claim 2 further including forming a silicon diffusion layer containing high-concentration p-type impurity in an area of the p-type single crystal silicon substrate to correspond to the connection opening after the formation of the insulation layer.

4. The method according to claim 3, wherein the connection opening is smaller than the opening of the n-type silicon embedded layer.

5. The method according to claim 1, wherein the formation of n-type silicon layer includes forming a first epitaxial growth layer made of n-type silicon on the n-type silicon embedded layer and the p-type single crystal silicon substrate, and forming a second epitaxial growth layer on the first epitaxial growth layer.

6. The method according to claim 1 further including forming a deformation gauge on the n-type silicon layer.

7. The method according to claim 6 further including:

forming an interlayer insulation layer on the n-type silicon layer such that the silicon diffusion layer is exposed;

forming a wiring on the interlayer insulation layer; and forming a protection film, which covers an area excluding the diffusion layer to expose the surface of the silicon diffusion layer.

8. A method for anodizing a silicon substrate comprising:

providing a p-type single crystal, silicon substrate;

forming an n-type silicon embedded layer made of n-type silicon on a predetermined area of a first surface of the p-type single crystal silicon layer, wherein an opening for permitting a current to flow is formed in the center of the n-type silicon embedded layer;

forming an n-type silicon layer on the first surface of the p-type single crystal silicon substrate and on the n-type silicon embedded layer, wherein the n-type silicon embedded layer spans the interface between the p-type silicon substrate and the n-type silicon layer;

forming a silicon diffusion layer containing a high-concentration p-type impurity on a predetermined area of the n-type silicon layer, wherein the silicon diffusion layer contacts at least the n-type silicon embedded layer in the vicinity of the interface between the p-type single crystal silicon substrate and the n-type silicon embedded layer;

forming an electrode layer on a second surface, which is on the opposite side of the p-type silicon substrate from the first surface;

connecting the anode of a DC power source to the electrode layer and connecting the cathode to a counter electrode, which is opposed to the p-type silicon substrate; and concentrating a current flow to an area corresponding to the opening of the n-type silicon layer in a direction from the second surface of the p-type single crystal silicon substrate toward the first surface, and advancing porosity formation in the area from the first surface toward the second surface.

9. The method according to claim 8 further including forming an insulation layer having a connection opening on the second surface of the p-type single crystal silicon substrate to correspond to the opening of the n-type silicon layer; and the formation of the electrode layer includes electrically connecting the electrode layer to the p-type single crystal silicon substrate through the connection opening.

10. The method according to claim 9 further including forming a silicon diffusion layer containing high-concentration p-type impurity in an area of the p-type single crystal silicon substrate to correspond to the connection opening after the formation of the insulation layer.

11. The method according to claim 10, wherein the connection opening is smaller than the opening of the n-type silicon embedded layer.

12. The method according to claim 8, wherein the formation of n-type silicon layer includes forming a first epitaxial growth layer made of n-type silicon on the n-type silicon embedded layer and the p-type single crystal silicon substrate, and forming a second epitaxial growth layer on the first epitaxial growth layer.

13. The method according to claim 8, wherein the formation of the silicon diffusion layer includes forming the silicon diffusion layer such that the layer contacts the p-type single crystal silicon substrate and the n-type silicon embedded layer.

14. The method according to claim 8 further including forming a deformation gauge on the n-type silicon layer.

15. The method according to claim 14 further including:

forming an interlayer insulation layer on the n-type silicon layer such that the silicon diffusion layer is exposed;

forming a wiring on the interlayer insulation layer; and forming a protection film, which covers an area excluding the diffusion layer to expose the surface of the silicon diffusion layer.

* * * * *